(12) United States Patent
Chang et al.

(10) Patent No.: US 6,700,511 B1
(45) Date of Patent: Mar. 2, 2004

(54) DATA CONVERSION METHOD, METHOD FOR OBTAINING WAVEFORM INFORMATION FROM SQUARE WAVE USING THE SAME, AND METHOD FOR GENERATING SQUARE WAVE FROM WAVEFORM INFORMATION USING THE SAME

(75) Inventors: Tae-Gyu Chang, Seoul (KR); Jee-Tae Park, Seoul (KR)

(73) Assignee: Myongji University, Seoul (KR)

( * ) Notice: Subject to any disclaimer, the term of this patent is extended or adjusted under 35 U.S.C. 154(b) by 0 days.

(21) Appl. No.: 10/369,504

(22) Filed: Feb. 21, 2003

(30) Foreign Application Priority Data

Dec. 11, 2002 (KR) .................................. 10-2002-78575

(51) Int. Cl.[7] .............................................. H03M 7/12
(52) U.S. Cl. ........................................ 341/69; 341/68
(58) Field of Search ............................. 341/69, 63, 68, 341/62, 67, 56, 59, 136, 108; 327/407, 154; 375/375

(56) References Cited

U.S. PATENT DOCUMENTS

| | | | | |
|---|---|---|---|---|
| 4,523,179 A | * | 6/1985 | Kapral | ....................... 341/136 |
| 4,567,464 A | * | 1/1986 | Siegel et al. | ................... 341/59 |
| 4,622,536 A | * | 11/1986 | Shih et al. | ................... 341/108 |
| 5,132,554 A | * | 7/1992 | Hiramatsu et al. | ......... 327/154 |
| 5,712,884 A | * | 1/1998 | Jeong | .......................... 375/375 |
| 5,714,904 A | * | 2/1998 | Jeong | .......................... 327/407 |

* cited by examiner

*Primary Examiner*—Jean Jeanglaude
(74) *Attorney, Agent, or Firm*—Greenblum & Bernstein, P.L.C.

(57) ABSTRACT

The present invention relates to a data conversion method for providing efficient conversion between data of different unit lengths, a method for obtaining waveform information from a square wave using the same, and a method for generating the square wave from the waveform information using the same. According to the data conversion method of the present invention, there is an advantage in that data compression and data decompression can be readily and efficiently performed. Further, according to the method of obtaining the waveform information and the method of generating the square wave using the data conversion method of the present invention, there are advantages in that the waveform information can be efficiently generated from the square wave signal and the square wave signal can be efficiently generated from data on the waveform information of the square wave.

18 Claims, 10 Drawing Sheets

| (B15, B14) | 1 | 2 | 3 |
|---|---|---|---|
| (0, 1) | 0xFF | | |
| (1, 0) | 0xFF | 0xFF | |
| (1, 1) | 0xFF | 0xFF | 0xFF |

DATA CONVERSION METHOD, METHOD
FOR OBTAINING WAVEFORM
INFORMATION FROM SQUARE WAVE
USING THE SAME, AND METHOD FOR
GENERATING SQUARE WAVE FROM
WAVEFORM INFORMATION USING THE
SAME

BACKGROUND OF THE INVENTION

1. Field of the Invention

The present invention relates to a data conversion method for providing efficient conversion between data of different unit lengths, a method for obtaining waveform information from a square wave using the same, and a method for generating the square wave from the waveform information using the same.

2. Background of the Invention

Hitherto, there is a demand for an efficient method for performing conversion between data with different data formats, for the main purpose of data compression. The conventional data conversion methods for accomplishing the object are different from one another in view of their specific conversion schemes in accordance with their application areas. The present invention discloses a method for performing efficient data conversion between different formats in case where their unit lengths are different from one another, i.e. when one is 16 bit long while the other is 8 bit long.

In addition, there is heretofore a demand for a method for generating digital waveform information from input signals and conversely generating an original waveform of the signals from the waveform information of digital data, for the main purpose of information storage and reuse. Thus, the present invention specifically discloses methods for obtaining waveform information and generating a square wave, which allow data compression efficiency to be improved by employing the aforementioned data conversion method when generating the digital waveform information from the square wave input signals and generating the original square wave signals from the waveform information of the digital data.

SUMMARY OF THE INVENTION

Accordingly, an object of the present invention is to provide a data conversion method for providing efficient data conversion between data of different unit lengths, a method for obtaining waveform information from a square wave using the data conversion method, and a method of generating the square wave from the waveform information using the data conversion method.

BRIEF DESCRIPTION OF THE DRAWINGS

The above and other objects, advantages and features of the present invention will become apparent from the following description of preferred embodiments given in conjunction with the accompanying drawings, in which.

DETAILED DESCRIPTION OF THE PREFERRED EMBODIMENTS

Hereinafter, the present invention will be described in detail with reference to the accompanying drawings.

Figures 1A, 1B:
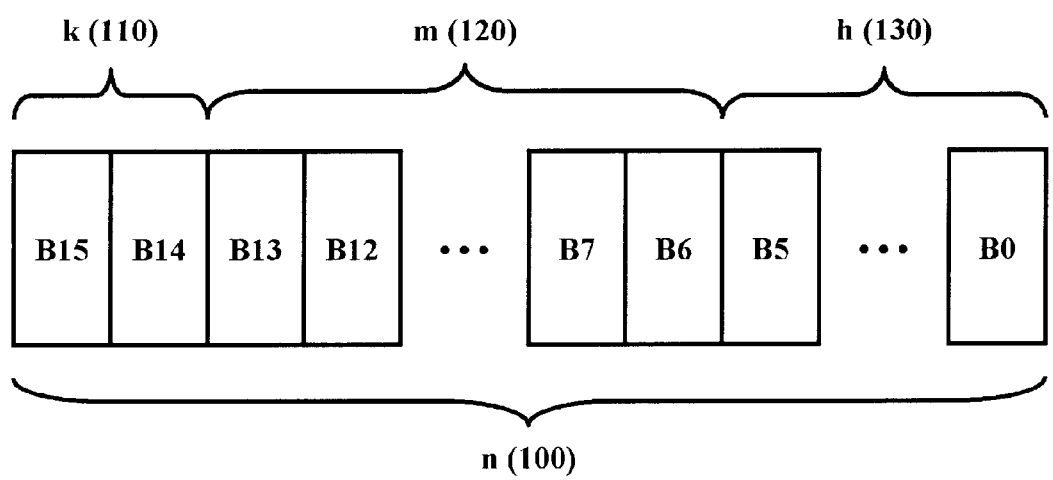
FIGS. 1A and 1B are diagrams showing a preferred embodiment in which n-bit data are divided into three bit groups and then the divided three bit groups are processed for performing efficient data conversion in a data conversion method of the present invention.

FIG. 1 is a diagram showing a preferred embodiment in which n-bit data 100 are divided into three bit groups 110, 120 and 130 and the divided three bit groups are processed for performing efficient data conversion in a data conversion method according to the present invention. As shown in FIG. 1(a), 16-bit data B15 to B0 are divided into three bit groups, i.e. a first bit group 110, a second bit group 120, and a third bit group 130. Herein, as an example of bit assignment for the respective bit groups 110, 120 and 130, two most significant bits B15, B14 are assigned to the first bit group 110, the next eight bits B13–B6 are assigned to the second bit group 120, and the remaining six least significant bits B5–B0 are assigned to the third bit group 130. For the convenience of explanation, the number of bits of entire data 100 is expressed as "n"; and the numbers of bits assigned to the first, second and third bit groups 110, 120 and 130 are expressed as "k", "m" and "h", respectively.

According to the data conversion method of the present invention, among the bit groups 110, 120 and 130 shown in FIG. 1(a), the third bit group 130 is ignored, the second bit group 120 is used as it is, and the first bit group 110 is specially processed. That is, the specific value of the third bit group 130 is ignored, the specific value of the second bit group 120 is used without modification, and the specific value of the first bit group 110 is processed with special consideration, which will be described later with reference to FIGS. 2 and 3.

FIG. 1(b) is a diagram showing a case where a predetermined value, for example 0xFF, is outputted for the aforementioned further processing of the first bit group 110. As shown in the figure, the predetermined value is outputted once, twice and three times, if the specific values of the first bit group 110 are 1, 2 and 3, respectively. Although it is not shown in the figure, the predetermined value is not outputted if the specific value of the first bit group 110 is 0.

Figure 2:
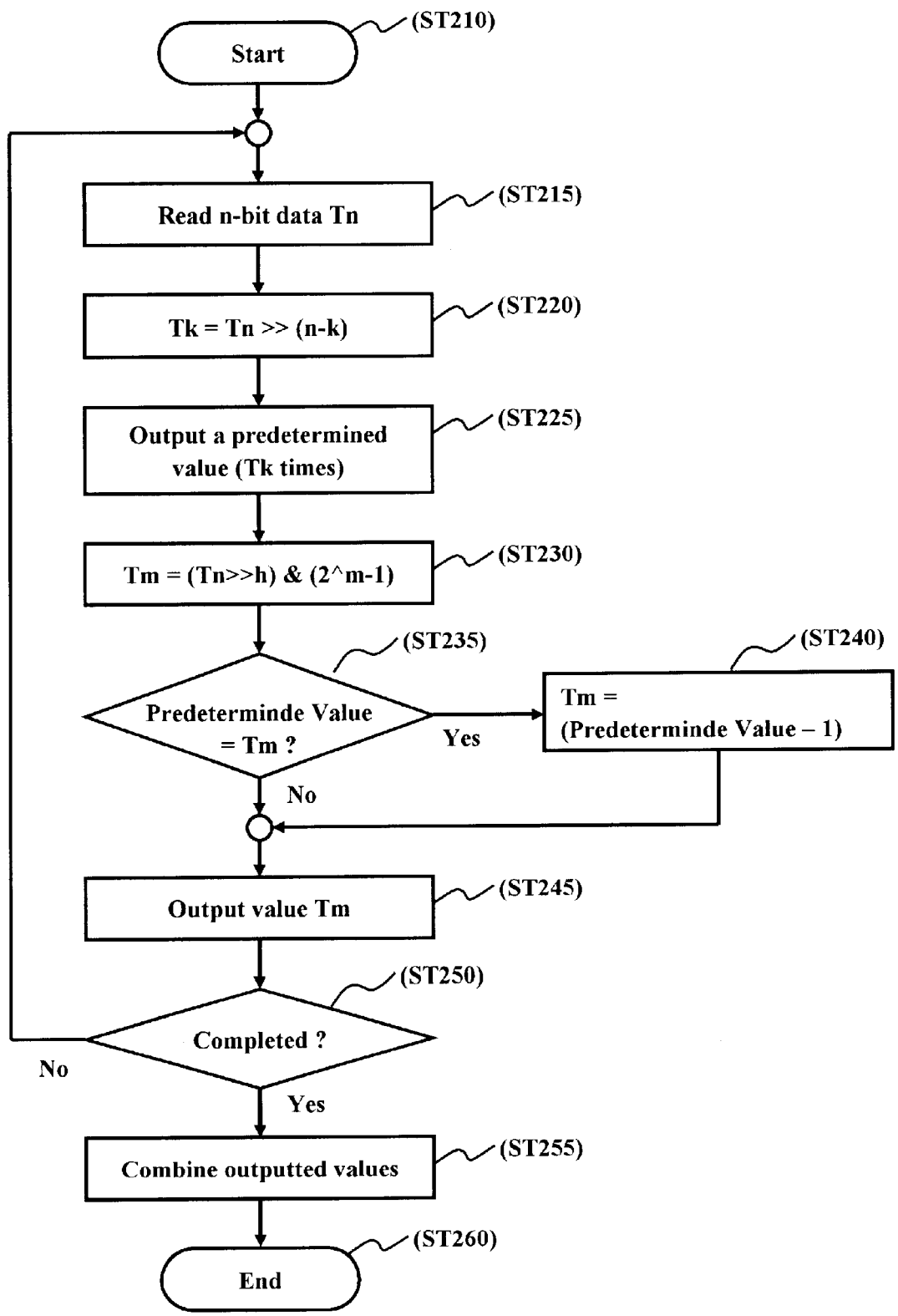
FIG. 2 is a flowchart illustrating an operation example of an encoding process in the data conversion method of the present invention.

FIG. 2 is a flowchart illustrating an operation example of an encoding process of the data conversion method according to the present invention. As described above, in the data conversion method of the present invention, it is assumed that the unit lengths of the data before and after the data conversion are different from each other in view of their data structure. Herein, a process of converting the first data with its larger basic data length larger into the second data with its smaller basic data length is called "encoding" and the reverse process is called "decoding". FIG. 2 shows the encoding process of the present invention.

In the operation example shown in FIG. 2, the first data before the data conversion has n-bit data as its basic unit. As described above in connection with FIG. 1, in the example, these n-bit data are divided into the three bit groups so that the predetermined conversion operation for the three divided bit groups can be performed. As shown in FIG. 1, the numbers of bits assigned to the first, second and third bit groups are also expressed as "k", "m" and "h", respectively.

In the example shown in FIG. 2, the n-bit data Tn are first read out from the first data (ST215), and the k-bit most significant area Tk corresponding to the first bit group is extracted from these n-bit data (ST220). If its value of the area Tk is not 0, the predetermined m-bit value, e.g. 0xFF, is outputted as many times as the value (ST225). Then, after the next m-bit area Tm corresponding to the second bit group is extracted from these n-bit data (ST230), it is checked whether its value of the area Tm is equal to the aforementioned predetermined value, e.g. 0xFF (ST235). If so, the specific value of the area Tm is set as a value different from the predetermined value, e.g. 0xFE (ST240), and the specific value of the area Tm corresponding to the second bit group is outputted (ST245). Thereafter, it is checked whether data conversion of the first data is completed, i.e. whether the data to be further converted remain in the first data (ST250). If there still remain the data to be converted in the first data, the routine goes into step ST215. Otherwise, one or more output m-bit values are combined to configure the second data (ST255).

As described in the above flowchart, if the specific value of the area corresponding to the second bit group is equal to the predetermined m-bit value (ST235) and then the former is equal to the latter, the specific value of the area is set as the value different from the predetermined value (ST240). The reason is that sameness and uniqueness of the meaning of the predetermined m-bit value in view of the contents of the second data. Furthermore, the aforementioned "different values" is preferably selected in such a manner that they are different from but similar to the "predetermined m-bit value". In the example of FIG. 2, the values of 0xFE and 0xFF are used.

Figure 3:
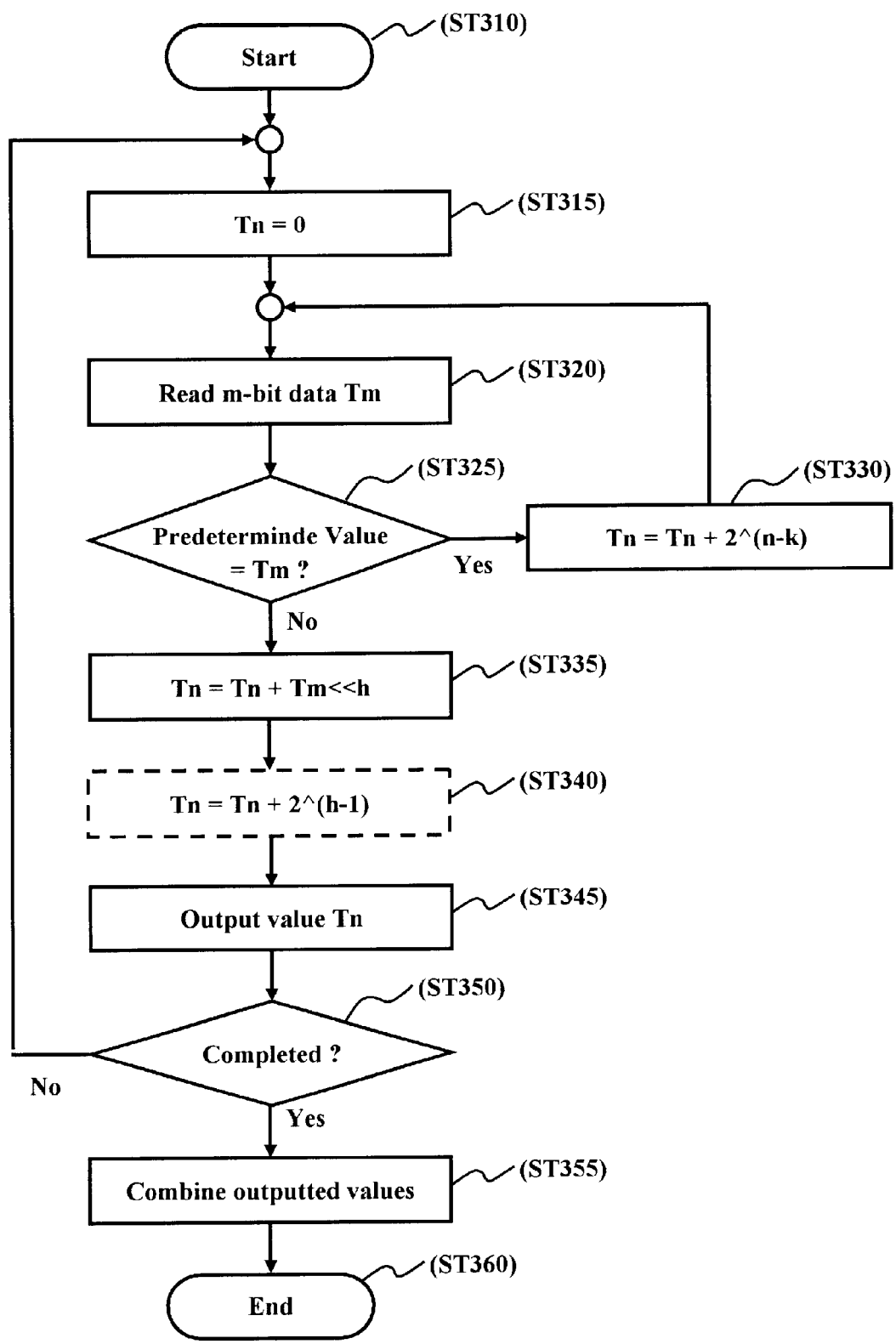
FIG. 3 is a flowchart illustrating an operation example of a decoding process in the data conversion method of the present invention.

FIG. 3 is a flowchart illustrating an operation example of a decoding process of the data conversion method according to the present invention. The operation example shown in FIG. 3 corresponds to a conversion process reverse to the operation example of the encoding process as described above in connection with FIG. 2. That is, in this flowchart, the first data before the data conversion has the m-bit data as its basic unit, while the second data having the n-bit data as its basic unit is obtained through the conversion process of this example.

In this example, the n-bit variable Tn is first initialized as a predetermined value (ST315), and the m-bit data Tm is read out from the first data (ST320). Then, it is checked whether the value of the data Tm is equal to the predetermined value (ST325). If so, the value of $2^{n-k}$, i.e. a value corresponding to the basic unit of the first bit group is added to the n-bit variable Tn (ST330), and then, the routine goes into step ST320. Otherwise, the values of the data Tm are shift left as much as h bits and then added to the n-bit variable Tn. At this time, in order to compensate for any errors that may occur when the least significant h bits are filled with 0 by means of the aforementioned left shift operation, it is more preferred that a predetermined offset value be added thereto (ST340). However, the offset value need not be added thereto if the error is negligible according to the application area of the data conversion method of the present invention. In the example shown in FIG. 3, the aforementioned offset value is preferably $2^{h-1}$ corresponding to a half of a maximum error value. However, the present invention is not limited thereto and the offset value can be suitably selected within a range that it does exceed the maximum error value. In addition, it is checked whether the data to be currently processed remain in the first data (ST350). Then, if so, the routine goes into step ST315; and otherwise, the second data is configured by combining one or more output n-bit values (ST355).

Furthermore, the process of adding the predetermined offset value (ST340) may be implemented in a slightly different manner from that shown in FIG. 3. For example, if the value of the n-bit variable Tn is initialized to the predetermined offset value, e.g. $2^{h-1}$, in step ST315, the process of adding the offset value as in step ST340 is not necessary.

Figure 4:
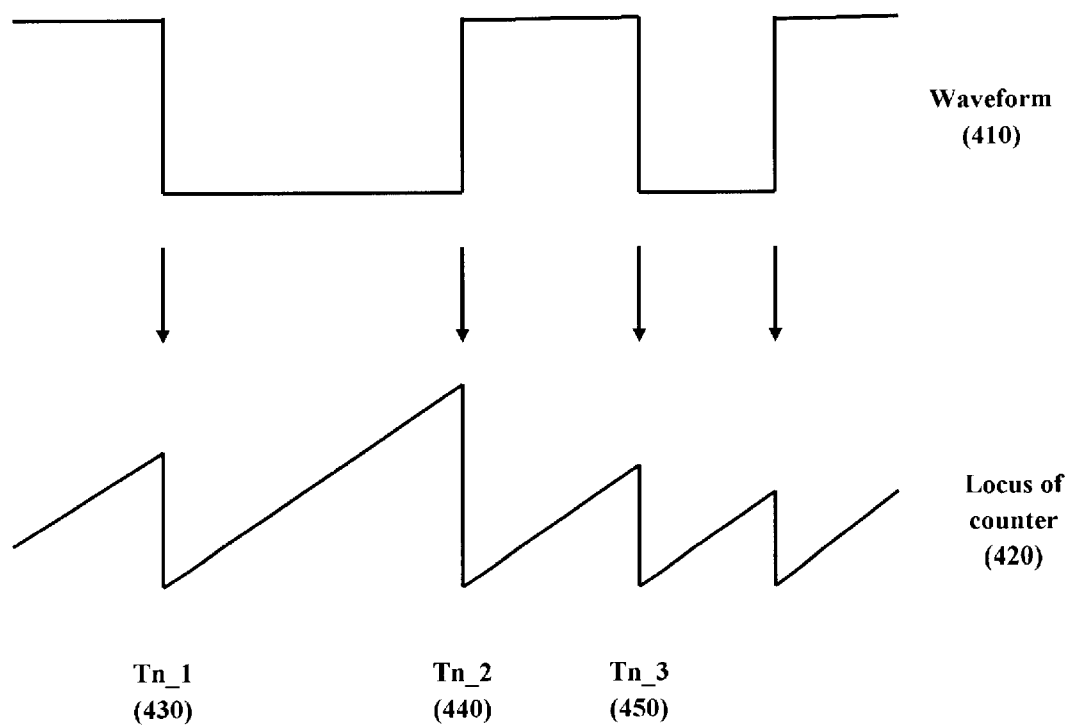
FIG. 4 is a diagram showing an example of a waveform of a square wave signal and a locus of a free-running counter corresponding thereto in a method of obtaining waveform information according to the present invention.

FIG. 4 is a diagram showing a waveform 410 of a square wave signal and a locus 420 of a free-running counter corresponding thereto in a method of obtaining waveform information according to the present invention. In the present invention, the free-running counter is used to measure a pulse width of the square wave signal 410. To this end, the counter is reset and restarted at both edges, i.e. rising and falling edges of the square wave signal 410, and values of the counter at the moments are captured by the predetermined internal register as 430, 440 and 450. In addition, it is preferred that interrupts are generated at the rising and falling edges in order to process the values of the counter.

Meanwhile, it is not necessarily essential to the present invention that the free-running counter be reset and restarted at the both edges. That is, even though the values of the counter at the moments of the rising and falling edges are captured as 430, 440 and 450 while free running without being reset and restarted, the values of the counter corresponding to the pulse width of the square wave signal 410 can be obtained by performing a subtracting operation with respect to a previous value of the counter ("pre-counter"). However, if the values of the counter corresponding to the pulse width are to be calculated, an overflow event of the free-running counter must be considered in either case where the counter is reset and restarted or merely free running. The overflow event will be explained later.

Figure 5:
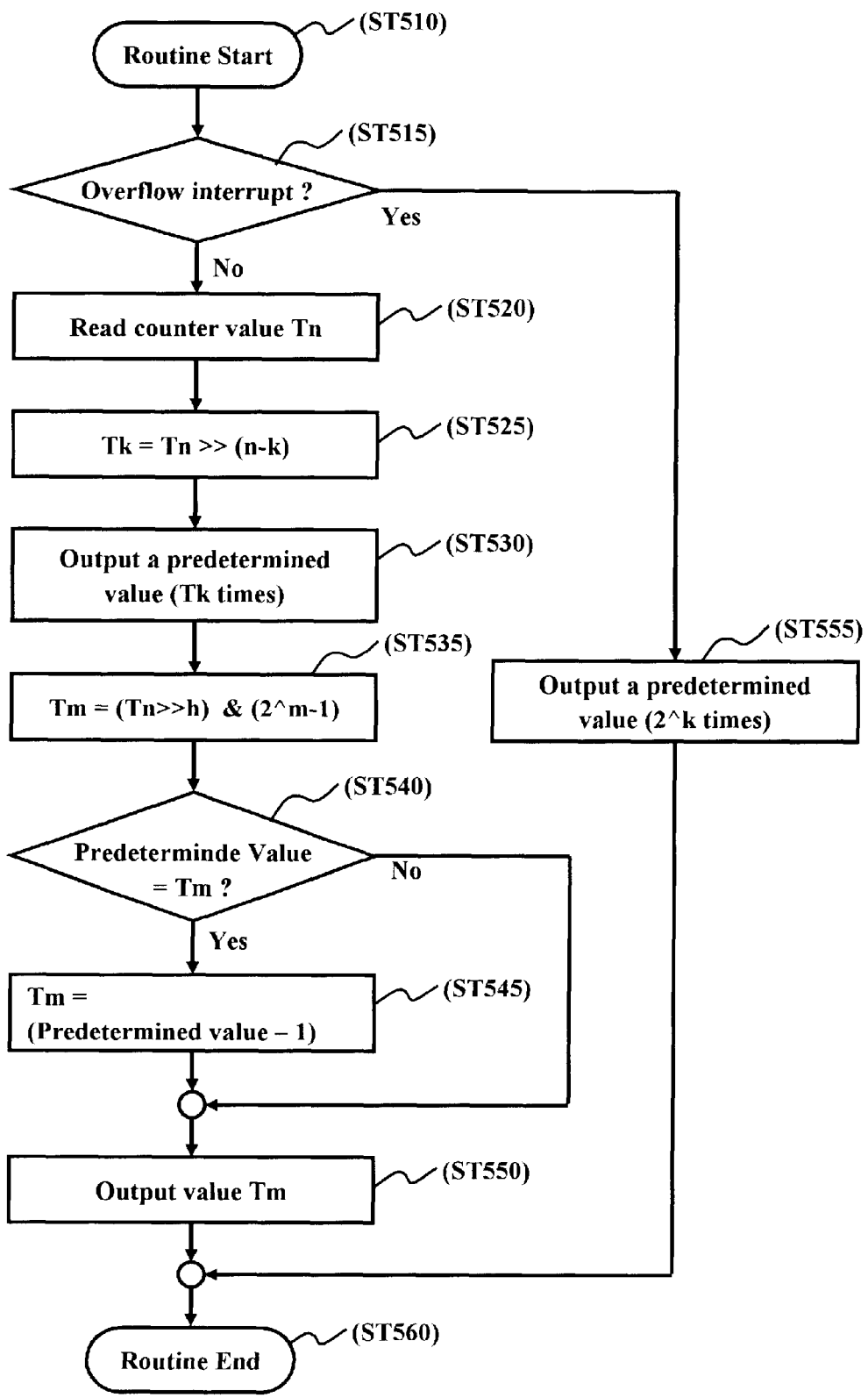
FIG. 5 is a flowchart illustrating a preferred embodiment in which the waveform information is generated in response to a system interrupt in the method of obtaining the waveform information according to the present invention.

FIG. 5 is a flowchart illustrating a preferred embodiment in which the waveform information of the square wave is stored in response to a system interrupt in the method of obtaining the waveform information according to the present invention. The routine ST510 to ST560 shown in FIG. 5 is preferably performed when any interrupts are generated at the rising and falling edges of the square wave signal, and it may be configured to be performed either in an interrupt service routine or in a typical program by transmitting a message to a task in the interrupt service routine. The present invention is not limited thereto.

Comparing FIG. 5 with FIG. 2, it will be readily understood that the embodiment of the method of obtaining the waveform information as shown in FIG. 5 basically employs the data conversion method as shown in FIG. 2. Therefore, as described above with reference to FIG. 2, the value of the counter, which is captured by and generated from the free running counter, is an n-bit value; and then it is divided into three bit groups so that the predetermined conversion operation can be performed, as described in connection with FIGS. 1 and 2. The symbols k, m and h are used in the same manner as described with reference to FIGS. 1 and 2. As shown in FIG. 5, it is assumed that the free-running counter is reset and restarted at the both edges of the square wave and the interrupts are generated for the overflow event of the free-running counter.

In this embodiment, the routine starts in response to the interrupt (ST510) and a cause of the interrupt is checked (ST515). In a case where the interrupt is due to the overflow event of the free-running counter, the predetermined value (for example, 0xFF) is outputted as many times as the value of $2^k$ (ST555) and the routine is terminated (ST560). On the other hand, in a case where the interrupt is not due to the overflow event, it is determined that the interrupt is due to either one of the both edges, i.e. the rising and falling edges, and thus, the routine goes into step ST520. It will be apparent that the interrupt may be generated due to various causes other than the aforementioned causes if a system is actually configured by employing the method of obtaining the waveform information according to the present invention. However, it is assumed herein that the interrupt is generated due to only these three causes.

In the case where the interrupt is due to the both edges of the square wave signal, an n-bit value Tn of the counter is first read out (ST520), and the most significant k-bit area Tk corresponding to the aforementioned first bit group is then extracted from the n-bit value Tn of the counter (ST525). If the extracted value is not 0, the predetermined value, e.g. 0xFF, is outputted as many times as the extracted value (ST530). Thereafter, the next m-bit area Tm corresponding to the second bit group is extracted from the aforementioned n-bit value of the counter (ST535), and it is then checked whether the extracted value of the area Tm is equal to the aforementioned predetermined value, e.g. 0xFF (ST540). If so, the value of the area Tm is set as a value, e.g. 0xFE, different from the predetermined value (ST545). Finally, the value of the second bit group area Tm is outputted (ST550).

Figure 6:
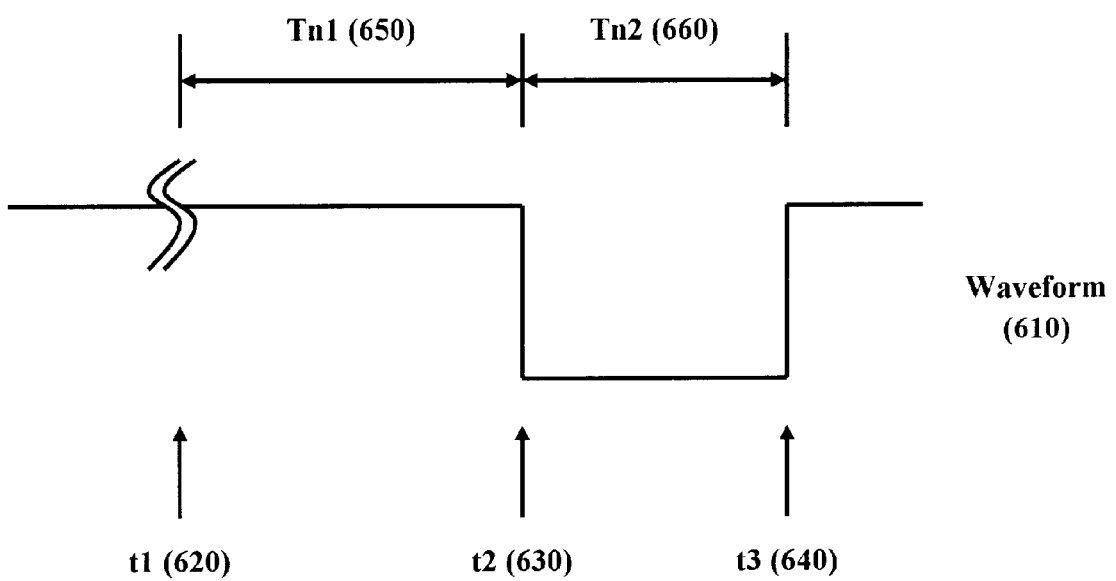
FIG. 6 is a diagram showing an example of a basic configuration for generating the square wave signal from the waveform information in a method of generating the square wave according to the present invention.

FIG. 6 is a diagram showing a basic configuration for generating the square wave signal from the waveform information in the method of generating the square wave according to the embodiment of the present invention. FIG. 6 shows an example of generating a waveform 610 of the square wave using a PWM signal generating module, but the present invention is not limited thereto. The PWM signal generating module employed in the embodiment includes a predetermined control register and thus performs a kind of timer function as follows: When a proper value of a timer is set and then the signal generating module is activated, the module causes the value of the timer to be counted down by using a reference clock and then a high/low level of the output waveform 610 to be reversed and thus the interrupt to be generated when the countdown value of the timer reaches 0.

In the embodiment of the present invention shown in FIG. 6, the value of Tn1 650 corresponding to a desired high-level pulse width is assigned to the control register and then the signal generating module is activated at time of t1 620. Then, the signal generating module causes the value of Tn1 650 to be counted down by using the reference clock, and also causes the level of the output waveform 610 to be reversed to a low level thereof and the system interrupt to be generated at a time of t2 630 when the countdown value reaches 0. Subsequently, the value of Tn2 660 corresponding to the next desired low-level pulse width is assigned to the control register and the signal generating module is activated at the time of t2 630. Then, the signal generating module causes the value of Tn2 660 to be counted down by using the basic clock, and causes the level of the output waveform 610 to be reversed to a high level thereof and thus the system interrupt to be generated at a time of t3 640 when the countdown value reaches 0.

In the embodiment of the present invention, a process of calculating the value of the timer used for generating the next interval of the pulse may be performed either in advance before the system interrupt for the current pulse will be generated or after the system interrupt is generated. That is, in order to generate the low-level interval between the time of t2 630 and the time of t3 640 as shown in FIG. 6, the value of Tn2 660 of the timer to be assigned to the control register can be calculated either prior to the time of t2 630, e.g. after the value of Tn1 650 is assigned to the control register and the signal generating module is activated, or after the system interrupt is generated at the time of t2 630, e.g. in the interrupt service routine. In order to generate the waveform 610 of an accurate remote control signal, it is more preferable to implement the former. However, if the latter is less sensitive to the accuracy, it is not impossible to implement the latter.

Meanwhile, there may be a PWM signal generating module which includes the first and second control registers for generating the PWM signal such that the waveform 610 of the remote control signal between the time of t1 620 and the time of t3 640 can be simultaneously generated when starting to operated after the values of Tn1 650 and Tn2 660 are assigned to the first and second control registers, respectively, or the values of Tn1 650+Tn2 660 and Tn2 660 are assigned to the registers, respectively, as in the case of the embodiment shown in FIG. 6. At this time, the signal generating module may be activated to generate the system interrupt either at both the time of t2 630 and the time of t3 640 or at only the time of t3 640.

Figure 7:
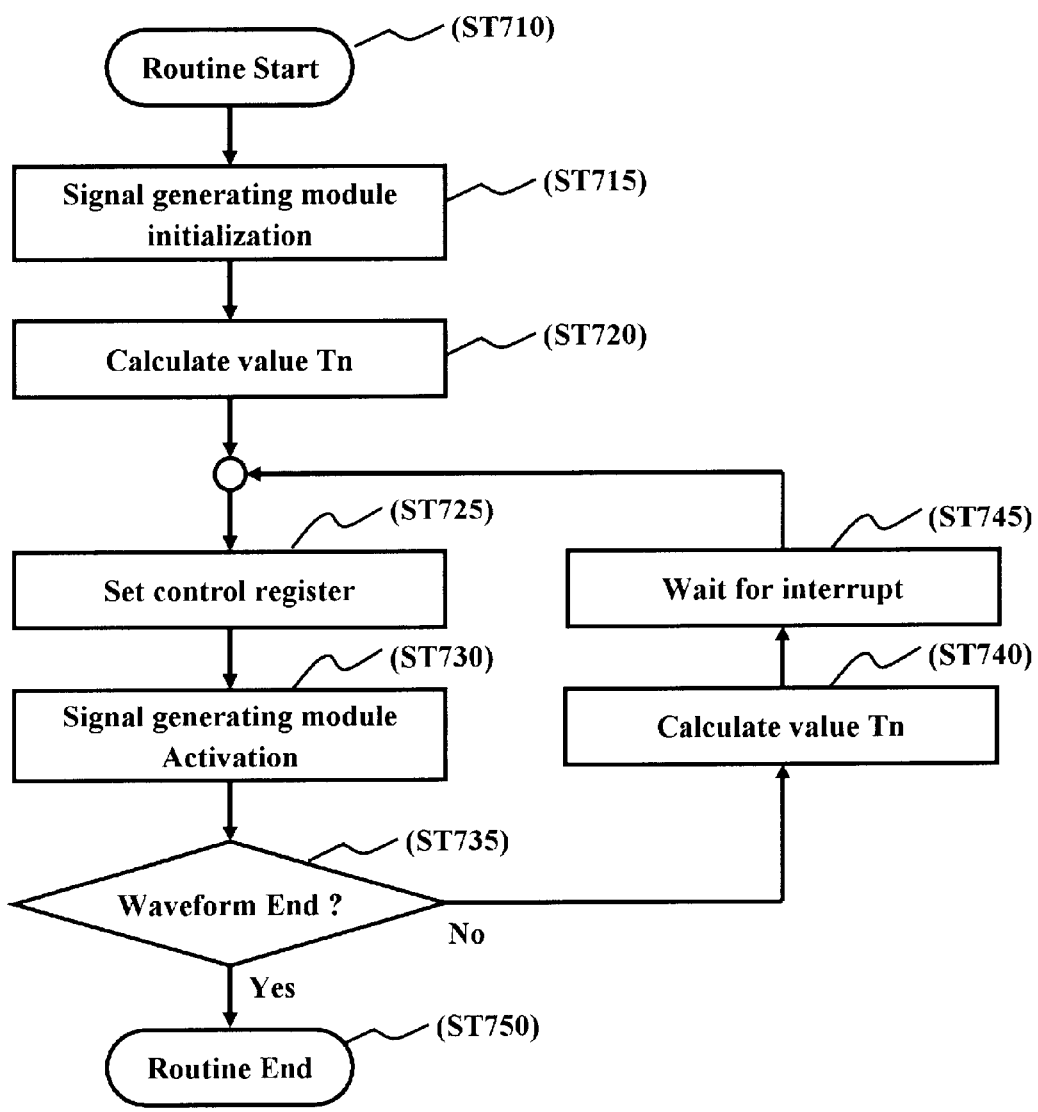
FIG. 7 is a flowchart illustrating a preferred embodiment in which the square wave signal is generated from the waveform information in the method of generating the square wave according to the present invention.

FIG. 7 is a flowchart illustrating a preferred embodiment in which the square wave is generated from the waveform information in the method of generating the square wave according to the present invention. In the figure, there is shown an example that one control register of the signal generating module shown in FIG. 6 is provided and the set value of the timer for the next pulse width is calculated in advance before the interrupt will be generated. In addition, it is assumed in the embodiment of FIG. 7 that the waveform information provided to generate the square wave signal includes a series of m-bit data since its format is equal to that obtained by the method of obtaining the waveform information according to the embodiment shown in FIG. 5. Furthermore, the data conversion method described above in connection with FIG. 3 is used as the process of calculating the set value of the n-bit timer used for generating the square wave waveform from the waveform information configured as such.

In this embodiment, in order to generate the square wave, the signal generating module is first initialized (ST715), and the timer set value of Tn corresponding to the desired pulse width of the square wave is calculated (ST720). Then, the control register of the signal generating module is set using the timer set value of Tn (ST725), and the signal generating module is activated (ST730). Thereafter, it is checked whether the square wave has been completely generated (ST735). If so, the routine is terminated (ST750). Otherwise, the timer set value of Tn corresponding to the next desired pulse width of the square wave is calculated beforehand (ST740) and the routine waits for the interrupt to occur (ST745). Then, when the interrupt is generated, the routine goes into step ST725 in which the control register is set as the timer set value calculated previously at step ST740. In this embodiment, the process of checking whether the square wave signal used at step ST735 has been completely generated is preferably achieved by checking whether valid data exist in waveform information data.

Figure 8:
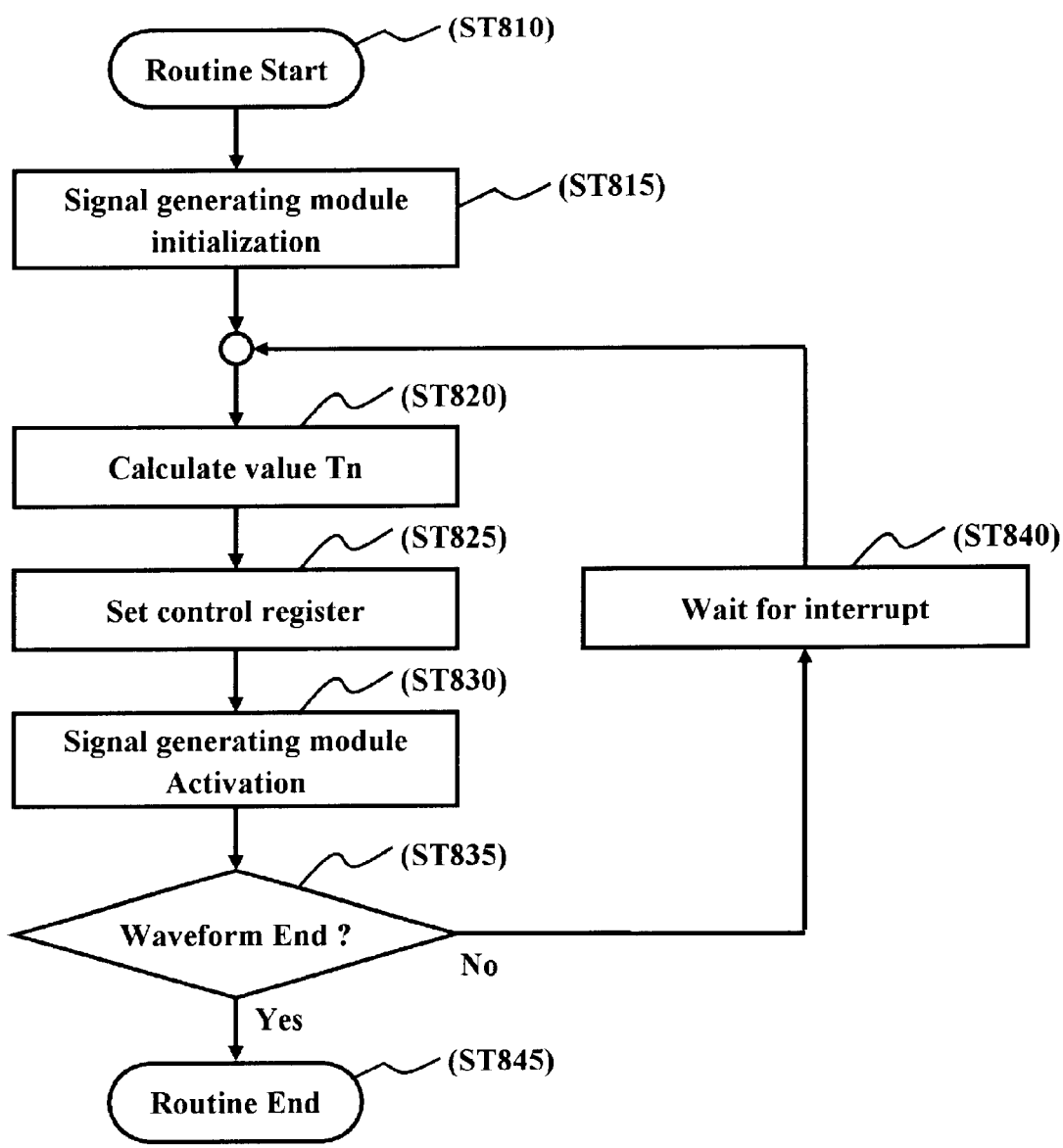
FIG. 8 is a flowchart illustrating another preferred embodiment in which the square wave signals is generated from the waveform information in the method of generating the square wave according to the present invention.

FIG. 8 is a flowchart illustrating another preferred embodiment in which the square signal is generated from the waveform information in the method of generating the square wave according to the present invention. The embodiment shown in FIG. 8 is identical to that shown in FIG. 7, except that the process of calculating the timer set value of Tn for the next desired pulse width is performed after the interrupt is generated, e.g. in the interrupt service routine (ST820). Thus, the other processes thereof are the same as and thus can be referred to the relevant processes described in connection with FIG. 7.

Figure 9:
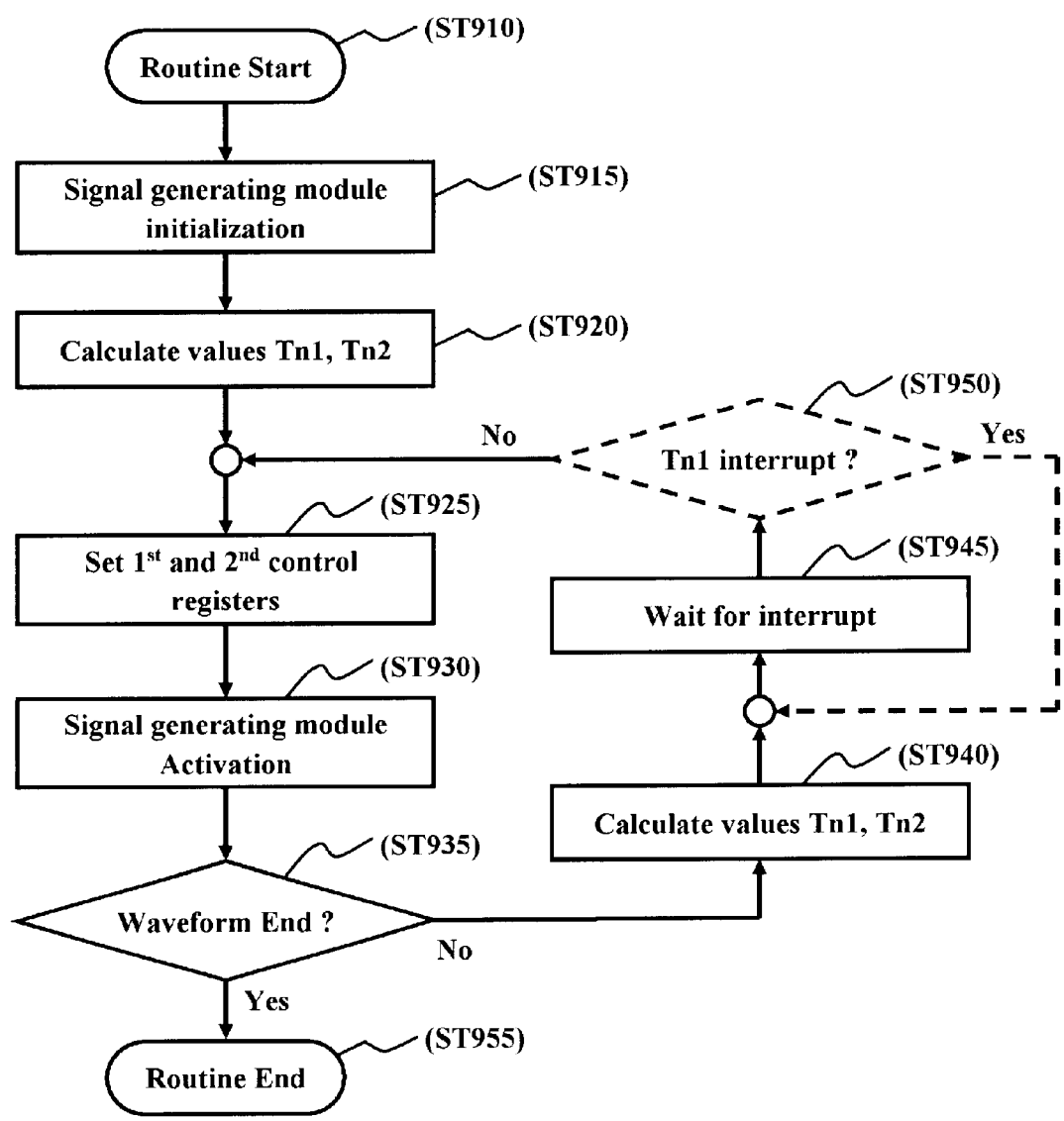
FIG. 9 is a flowchart illustrating a further preferred embodiment in which the square wave signal is generated from the waveform information in the method of generating the square wave according to the present invention.

FIG. 9 is a flow diagram showing a further preferred embodiment in which the square signal is generated from the waveform information in the method of generating the square wave according to the present invention. The embodiment shown in FIG. 9 is also similar to that shown in FIG. 7, but it is different from the embodiment of FIG. 7 in that the signal generating module can be activated to generate the two-level signal waveform of the square wave at one time since it includes the first and second control registers. At this time, as described above, the interrupt may be generated either once for the entire two-level signal waveform or twice depending on a microcomputer in use. In a case where the interrupt is generated twice, the causes of the interrupt are checked (ST950). If the interrupt is due to the first control register, i.e. due to an end of the previous pulse width, the routine operates to override the interrupt. The other processes thereof are the same as and thus can be referred to the relevant processes described in connection with FIG. 7.

Figure 10:
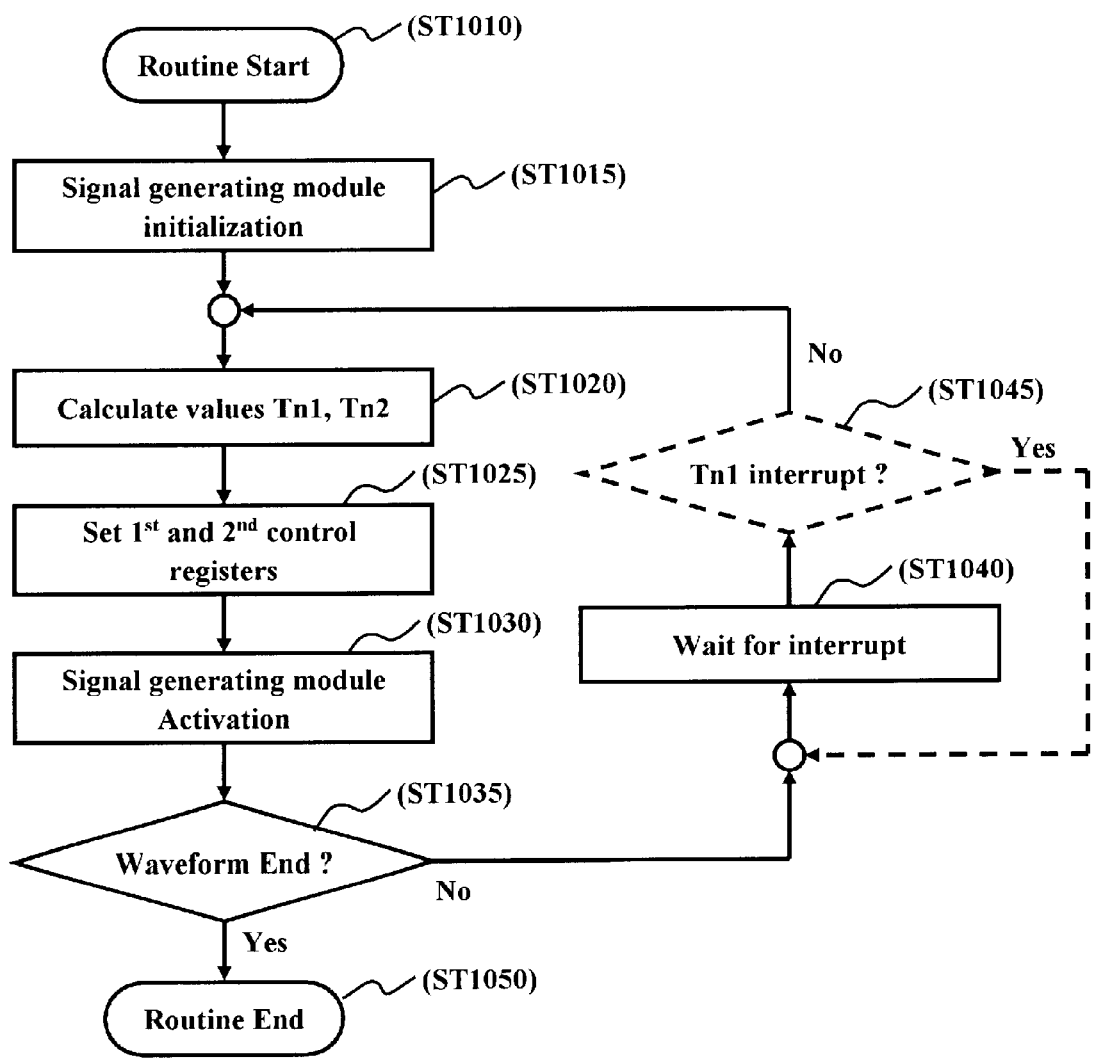
FIG. 10 is a flowchart illustrating a still further preferred embodiment in which the square wave signal is generated from the waveform information in the method of generating the square wave according to the present invention.

FIG. 10 is a flowchart illustrating a still further preferred embodiment in which the square signal is generated from the waveform information in the method of generating the square wave according to the present invention. The embodiment shown in FIG. 10 is almost identical to that shown in FIG. 9, except that the process of calculating the timer set values of Tn1 and Tn2 for the next desired two-level pulse width is performed after the interrupt is generated, e.g. in the interrupt service routine (ST1020). The other processes thereof are the same as and thus can be referred to the relevant processes described in connection with FIG. 9.

According to the data conversion method of the present invention, there is an advantage in that the data compression and data decompression can be readily and efficiently performed.

Further, according to the method of obtaining the waveform information of the present invention, there is another advantage in that the waveform information can be efficiently generated from the square wave signal.

In addition, according to the method of generating the square wave, there is a further advantage in that the square wave signal can be efficiently generated from the waveform information of the square wave.

What is claimed is:

1. A data conversion method for converting first n-bit data into second data including one or more m-bit data, where n and m (n>m) are natural numbers, comprising the steps of:
    (1) dividing the first data into a first bit group of k most significant bits, a second bit group of the next m bits, and a third bit group of the remaining h bits, respectively;
    (2) outputting a first predetermined m-bit value as many times as the value of the first bit group when the value of the first bit group is not equal to 0;
    (3) comparing the value of the second bit group with the first predetermined m-bit value, and outputting a second predetermined m-bit value that is different from the first predetermined m-bit value if the value of the second bit group is equal to the first predetermined m-bit value, or outputting the value of the second bit group if the value of the second bit group is different from the first predetermined m-bit value; and
    (4) configuring the second data by combining the one or more outputted m-bit values.

2. A data conversion method for converting first data including one or more m-bit data into second n-bit data, where n and m (n>m) are natural numbers, comprising the steps of:
    (1) initializing an n-bit variable with a predetermined initial value and determining a natural number k as a number of bits of a first bit group and a natural number h as a number of bits of a least significant bit group for the second data;
    (2) receiving the m-bit data from the first data;
    (3) if the received m-bit data are equal to a predetermined m-bit value, adding the value of $2^{n-k}$ to the n-bit variable and then going into step (2);
    (4) adding a n-bit value obtained by left-shifting the received m-bit data by h bits to the n-bit variable; and
    (5) setting the value of the n-bit variable as the second data.

3. The method as claimed in claim 2, further comprising the step of:
    (4a) adding a predetermined offset value, which is a natural number smaller than $2^h$, to the n-bit variable prior to step (5),
    wherein steps (4) and (4a) are performed irrespective of their order.

4. The method as claimed in claim 1, wherein the natural number n is 16, the natural number m is 8, the natural number k is 2, the natural number h is 6, and the first predetermined m-bit is 0xFF.

5. A method of obtaining waveform information for generating the waveform information of a square wave signal in the form of waveform information data including a series of m-bit data, where n and m (n>m) are natural numbers, comprising the steps of:
    (1) initializing a predetermined pre-counter variable, setting to generate an interrupt by both edges of the square wave signal and an overflow event of a predetermined n-bit free-running counter, and setting to capture the value of the n-bit counter to a predetermined register for the both edges;
    (2) waiting for the interrupt to occur;

(3) checking a cause of the interrupt, if the interrupt is generated;

(4) reflecting occurrence of the overflow event onto a predetermined overflow variable, if the interrupt is due to the overflow event of the n-bit counter;

(5a) obtaining data on a pulse width corresponding to that of the square wave signal from the register, the overflow variable and the pre-counter variable, if the interrupt is due to the edges of the square wave signal;

(5b) separating lower n-bit valid data and higher overflow data from the pulse width data;

(5c) outputting a first predetermined m-bit value as many times as a first number if the value of the overflow data is not equal to 0, where the first number is a value obtained by multiplying the value of the overflow data by $2^k$ for a natural number k equal to or smaller than the value of (n−m);

(5d) outputting the first predetermined m-bit value as many times as a second number if the value of a higher k-bit area in the valid data is not equal to 0, where the second number is the value of the higher k-bit area in the valid data;

(5e) outputting the value of an m-bit area if the value of the m-bit data following the higher k-bit area in the valid data is not equal to the first predetermined m-bit value, and outputting a second predetermined m-bit value different from the first predetermined m-bit value if the value of the m-bit data is equal to the first predetermined m-bit value;

(6) checking whether input of the square wave signal has been completed, and going into step (2) if the input of the square wave signal is not completed; and (7) combining one or more output m-bit values to configure the waveform information data.

6. A method of obtaining waveform information for generating the waveform information of a square wave signal in the form of waveform information data including a series of m-bit data, where n and m (n>m) are natural numbers, comprising the steps of:

(1) setting to generate an interrupt by both edges of the square wave signal and setting to reset and restart a predetermined n-bit free-running counter while the value of the n-bit counter is captured by a predetermined register at the both edges;

(2) waiting for the interrupt to occur;

(3a) reading out valid data corresponding to the value of the n-bit counter from the register;

(3b) outputting a first predetermined m-bit value as many times as the value of a higher k-bit area, if the value of the higher k-bit area in the valid data is not equal to 0 for a predetermined natural number k equal to or smaller than the value of (n−m);

(3c) outputting the value of an m-bit area if the value of the m-bit data following the higher k-bit area in the valid data is not equal to the first predetermined m-bit value, and outputting a second predetermined m-bit value different from the first predetermined m-bit value if the value of the m-bit data is equal to the first predetermined m-bit value;

(4) checking whether input of the square wave signal has been completed, and going into step (2) if the input of the square wave signal is not completed; and (5) combining one or more output m-bit values to configure the waveform information data.

7. A method of obtaining waveform information for generating the waveform information of a square wave signal in the form of waveform information data including a series of m-bit data, where n and m (n>m) are natural numbers, comprising the steps of:

(1) setting to generate an interrupt for both edges of the square signal and an overflow event of a predetermined n-bit free-running counter, and setting to reset and restart the n-bit counter while the value of the n-bit counter is captured by a predetermined register at the both edges;

(2) waiting for the interrupt to occur;

(3) checking a cause of the generated interrupt;

(4) outputting a first predetermined m-bit value as many times as a first number if the interrupt is due to the overflow event, where the first number is the value of $2^k$ for a natural number k equal to or smaller than the value of (n−m);

(5a) reading out valid data corresponding to the value of the n-bit counter from the register if the interrupt is due to the both edges of the square wave signal;

(5b) outputting the first predetermined m-bit value as many times as the value of a higher k-bit area if the value of the higher k-bit area in the valid data is not equal to 0;

(5c) outputting the value of an m-bit area if the value of the m-bit data following the higher k-bit area in the valid data is not equal to the first predetermined m-bit value, and outputting a second predetermined m-bit value different from the first predetermined m-bit value if the value of the m-bit data is equal to the first predetermined m-bit value;

(6) checking whether input of the square wave signal has been completed, and going into step (2) if the input of the square wave signal is not completed; and (7) combining one or more output m-bit values to configure the waveform information data.

8. The method as claimed in claim 5, wherein the natural number n is 16, the natural number m is 8, the natural number k is 2, and the first predetermined m-bit is 0xFF.

9. A method of generating a square wave for generating a square wave signal from waveform information data including a series of m-bit data, where n and m (n>m) are natural numbers, comprising the steps of:

(1) initializing a signal generating module assigned to generate the square wave;

(2) calculating one or more n-bit count values from the waveform information data;

(3) setting one or more predetermined control registers for controlling a pulse width of an output signal in the signal generating module by using the one or more n-bit count values;

(4) activating the signal generating module;

(5) checking whether the square wave signal has been completely generated, and terminating a process routine of the method if the generation of the signal is completed;

(6) calculating beforehand the one or more n-bit count values from the waveform information data; and (7) waiting until the interrupt is generated from the signal generating module and going into step (3) if the interrupt is generated, wherein processes of calculating the one or more n-bit count values from the waveform information data at steps (2) and (6) are performed by the data conversion method according to claim 2.

10. A method of generating a square wave for generating a square wave signal from waveform information data including a series of m-bit data, where n and m (n>m) are natural numbers, comprising the steps of:

(1) initializing a signal generating module assigned to generate the square wave;

(2) calculating one or more n-bit count values from the waveform information data;

(3) setting one or more predetermined control registers for controlling a pulse width of an output signal in the signal generating module by using the one or more n-bit count values;

(4) activating the signal generating module;

(5) checking whether the square wave signal has been completely generated, and terminating a process routine of the method if the generation of the signal is completed;

(6) waiting until the interrupt is generated from the signal generating module and going into step (2) if the interrupt is generated, wherein a process of calculating the one or more n-bit count values from the waveform information data at step (2) are performed by the data conversion method according to claim 2.

11. The method as claimed in claim 9, wherein it is first determined whether the interrupt is valid if the interrupt occurs and the interrupt is overridden if the interrupt is determined to be valid.

12. The method as claimed in claim 9, wherein the natural number n is 16, the natural number m is 8, the natural number k is 2, and the first predetermined m-bit is 0xFF.

13. The method as claimed in claim 2, wherein the natural number n is 16, the natural number m is 8, the natural number k is 2, the natural number h is 6, and the first predetermined m-bit is 0xFF.

14. The method as claimed in claim 3, wherein the natural number n is 16, the natural number m is 8, the natural number k is 2, the natural number h is 6, and the first predetermined m-bit is 0xFF.

15. The method as claimed in claim 6, wherein the natural number n is 16, the natural number m is 8, the natural number k is 2, and the first predetermined m-bit is 0xFF.

16. The method as claimed in claim 7, wherein the natural number n is 16, the natural number m is 8, the natural number k is 2, and the first predetermined m-bit is 0xFF.

17. The method as claimed in claim 10, wherein it is first determined whether the interrupt is valid if the interrupt occurs and the interrupt is overridden if the interrupt is determined to be valid.

18. The method as claimed in claim 10, wherein the natural number n is 16, the natural number m is 8, the natural number k is 2, and the first predetermined m-bit is 0xFF.

* * * * *